(12) United States Patent
Yoshida et al.

(10) Patent No.: US 7,436,729 B2
(45) Date of Patent: Oct. 14, 2008

(54) FUSE CIRCUIT AND SEMICONDUCTOR DEVICE USING FUSE CIRCUIT THEREOF

(75) Inventors: Hiroyasu Yoshida, Tokyo (JP); Kanji Oishi, Tokyo (JP); Naohisa Nishioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 59 days.

(21) Appl. No.: 11/242,021

(22) Filed: Oct. 4, 2005

(65) Prior Publication Data

US 2006/0072364 A1    Apr. 6, 2006

(30) Foreign Application Priority Data

Oct. 5, 2004   (JP)   .............................. 2004-293135

(51) Int. Cl.
  *G11C 17/18*   (2006.01)
(52) U.S. Cl. ........................ 365/225.7; 365/96; 365/200
(58) Field of Classification Search ................ 365/96 X, 365/189.05, 189.07, 200 X, 225.7 O, 96, 365/200, 225.7

See application file for complete search history.

(56) References Cited

U.S. PATENT DOCUMENTS 6,388,941 B2 * 5/2002 Otori et al. ............. 365/230.08
6,639,863 B2 * 10/2003 Imamura et al. ......... 365/225.7

FOREIGN PATENT DOCUMENTS

JP   3-22298 A   1/1991

* cited by examiner

*Primary Examiner*—VanThu Nguyen
(74) *Attorney, Agent, or Firm*—Sughrue Mion, PLLC

(57) ABSTRACT

A fuse circuit uses an electrically writable fuse circuit and comprises a first fuse unit provided with a first electrically writable fuse, and a second fuse unit provided with a second electrically writable fuse, and the state of logical add of the states of the first and second fuse units is used as the output of the electrically writable fuse circuit in the first and second fuse units. Reliability in writing in of the fuse can be improved by using such a fuse circuit for a redundancy decoder circuit or the like.

3 Claims, 4 Drawing Sheets

FUSE CIRCUIT AND SEMICONDUCTOR DEVICE USING FUSE CIRCUIT THEREOF

This application claims priority to prior Japanese patent application JP 2004-293135, the disclosure of which is incorporated herein by reference.

BACKGROUND OF THE INVENTION

1. Field of the Invention

The present invention relates to a fuse circuit, and in particular, to a circuit using an electrically writable fuse represented by the type which should be in a non-conducting state when being unwritten and be in a conducting state when being written (hereinafter, 'antifuse'). In particular, the present invention could be optimally applied to an option (operation mode set) circuit of a semiconductor device using a fuse and to a redundancy (redundancy relieving) decoder circuit of a semiconductor memory device using a fuse.

2. Description of the Related Art

Recently, a redundancy circuit (redundancy relieving circuit) has been used for relieving failure memory cell in a semiconductor memory device. For example, a DRAM having a set of 100-200 redundancy circuits per product can be used. In such a large quantity of redundancy circuits, a fuse decoder of a NOR type is used for performing dynamic operations in order to detect addresses to be used for redundancies. As for a fuse, it is the mainstream that a polysilicon or metallic thin film wire be used and blown by laser according to the address for detection.

FIG. 4 shows an example of such a fuse decoder structured in a NOR type in order to relieve a failure memory cell. In this figure, three sets of complementary addresses Ai, #Ai: i=0-2 (#Ai is the reverse phase of Ai, indicating notAi; hereinafter '#' means 'not' indicating a reverse signal) are input. An N-channel transistor QN01 and a fuse F01 are connected in series, and an N-channel transistor QN02 and a fuse F02 are also connected in series. Both circuits connected in series are further connected in parallel. Addresses A0, #A0 are input into the gates of the transistors QN01, QN02 respectively to constitute an address unit 001. 'Address unit' here means a circuit for determining which of complementary signal of the address is input or made effective for the redundancy decoder according to the state (being connected or disconnected) of the fuse.

The redundancy decoder is constituted by connecting the address unit 001 for inputting the complementary signals Ai, #Ai of the address Ai (i=0-2) into between the decoder connection node N41 and the ground (GND) in parallel, and a P-channel transistor QP01 inputting a pre-charge signal Pre as a gate input, connecting between the power source VDD and the connection node N41, and further by connecting two stages of inverters INV41, INV42 between the connection node N41 and the output Red of the redundancy decoder. A P-channel transistor QP42 inputting the output of the inverter INV41 as a gate input is connected between the power source VDD and the connection point N41 in order to hold a H-level (hereinafter, H-level is described as '1 level') of the connection point N41.

As the operation of the redundancy decoder, first, all the complementary address signals are set to be L-level (hereinafter, 'L-level' is described as '0 level') and the pre-charge signal Pre is set to be 0 level. Thereby, the transistor QP01 is in a conducting state, the connection node N41 is in 1 level, and the outputs Red are 1 level through two stages of inverters. Then, the pre-charge signal Pre is in 1 level and the transistor QP01 is in off state. Then, according to address input, either the complementary signal Ai, #Ai is in 1 level and the other stays in 0 level. At that time, it is determined whether or not the respective address units make current flow to the ground by the connection node N41 according to the state of the fuse.

How the operation of the address unit 001 is controlled according to the state of a fuse (discharge of the connection node N41 from 1 level to 0 level) is described using the address unit at address A0. When the fuse is in unwritten state or a conducting state, since any of the complementary signals A0, #A0 is always 1 according to the input level of the address signal and any of the transistors QN01, QN02 is in 'on' state, the address unit 001 always discharges the connection node N41, the connection node N41 constituted in NOR coupling of the address unit 001 regardless of the address and the output Red connected thereto are in 0 level, and the redundancy decoder is 'unselected'. Writing into the address unit is realized by blowing any of the fuses F01, F02 by laser. For example, when the fuse F02 on the reverse phase input side is blown at the address unit of address A0, a change in #A0 does not affect the output Red and whether or not the address unit is in a conducting state of address unit (A0) is determined only by the state of address A0. In other words, address A0 is wired to the redundancy decoder by the address unit at address A0.

When the fuses on reverse, normal, and reverse input sides sequentially from address A0 of the respective address unit 001 at addresses A0-A2 (fuses F02, F0, F02, sequentially) are blown and address input of three bits is (0, 1, 0), the respective address unit 001 does not make current flow, and the connection node N41 and the output Red are in 1 level and selected. When the other addresses are input, at least one of the address units 001 make current flow, and the output Red is in 0 level and unselected (address incoincidence).

As described above, though the NOR type in FIG. 4 is programmed in a fuse and can be structures in a simple circuit as a redundancy decoder, and accordingly, this type is widely used for a DRAM, the operation is limited to 'dynamic' (in 'static' operation, current normally flows). In order to solve the above mentioned problem, a redundancy decoder that can perform static operation is disclosed in the Japanese Patent Laid-Open No. 3-22298.

FIG. 5 shows such a conventional example, in which a fuse of laser blowing type such as polysilicon or metallic thin film is used for simplicity. As in FIG. 4, address signals used for redundancy are A0-A2. A fuse F03 and a P-channel transistor QP02 are used as load elements with N-channel transistors QN03, QN04 as drive elements and are flip-flop-connected, and a fuse unit 002 is constituted using the drain of the P-channel transistor QP02 as output. The output of the fuse unit and the address signal A0 are input into an exclusive NOR circuit XNOR02 and a redundancy address generating part 004 is constituted.

The fuse unit 002 and the redundancy address generating part 004 constitute the address unit 001 at address A0, and the output of the exclusive NOR circuit XNOR02 is output as a redundancy address RA0 at address A0. For other address signals A1, A2, redundancy addresses RA1, RA2 are output similarly by the address unit 001, in such a conventional example, a circuit is added for inputting a fixed level (here, ground level) instead of inputting address and for outputting enabling bits REn from the address unit 001. Redundancy addresses RA0, RA1, RA2 and enabling bits REn are input into an AND circuit AND02 and the output Red is used as the output of the redundancy decoder. Necessity of enabling bits REn will be described after describing the operation of the address unit 001.

A fuse unit 002 normally consists of a fuse-writing circuit, a read-out circuit and a circuit for holding read data. In this example, there is no electrically writing circuit since writing is performed by physically blowing a fuse by laser, and a read-out circuit and a holding circuit are integrated and cannot be distinguished. Accordingly, in the example, such circuits are not distinguished and this type of unit is merely called 'fuse unit'.

In the fuse unit 002, reading of a fuse is automatically performed by inputting power. Each contact of a flip flop consisting of a fuse F03, a P-channel transistor QP02, and N-channel transistors QN03, QN04 is in ground level before inputting power. When the fuse is not blown and power is input in a conducting state, the level of QP02 side contact (connecting point of drains at QP02 and QN04) is in ground level since both the transistors QP02 and QN04 are off while the transistor QN03 which receives the potential at the gate is off. As a result, the level of the fuse side contact (connecting point of the fuses F03 and the transistor QN03) increases following the power source VDD of which potential is rising. When the potential is above a threshold Vth of QN04, the transistor QN04 is on and for the flip flop, the QP02 side contact is determined to be in ground level and the fuse side contact to be in VDD level. Thus, reading completes and the output of the fuse unit 002 is 0 level. After that, the unit keeps such state till the power is off.

On the other hand, when the fuse is blown and in a non-conducting state, the fuse side contact keeps ground potential since there is no means for providing potential on the fuse side contact even when the power is input. In such a state, when the power VDD is risen and the potential is above a threshold Vth of P-channel transistor QP02, the transistor QP02 is on and for the flip flop, the QP02 side contact is determined to be in VDD level and the fuse side contact to be in ground level. Thus, reading completes and the output of the fuse unit 002 is 1 level. After that, the unit keeps such state till the power being off.

As described above, the output of the fuse unit 002 outputs 0 or 1 level according a conducting or non-conducting state of the fuse. The exclusive NOR circuit XNOR02 of the redundancy address generating part 004 is inputting output of the fuse unit and adoress A0, outputting the output RA0 of the address unit 001, it outputs A0 as the output RA0 when the fuse is in unwritten (conducting) state and it outputs #A0 when the fuse is in written (non-conducting) state. For the addresses A1, A2, too, the enabling bits REn output 0 as the output REn of the address unit 001 when the fuse is in unwritten (conducting) state and they output 1 when in written (non-conducting) state.

When only the outputs RA0-RA2 of the address unit 001 are input into an AND circuit and a redundancy decoder is constituted, all the inputs of the AND circuit are 1 even in unwritten state and an address is generated for selecting redundancy. In this example, since the outputs RA0-RA2 are 1 even in unwritten state when the address inputs of A0-A2 are 1, a problem might occur that when all the addresses are 1, they are always replaced to redundancy if the redundancy is determined only by RA0-RA2. In order to solve such a problem, the enabling bits are used. A redundancy decoder is constituted by inputting redundancy addresses RA0-RA2 and the enabling bits REn into an AND circuit AND02 and the enabling bits are written into a fuse unit, and thereby, a set of addresses are used to be an address of effective redundancy.

Using such a method that a polysilicon or metallic thin film fuse is blown by laser, a compact and safe redundancy selecting circuit can be obtained. However, such a method has the most weak point that writing should be performed before assembling a product. In particular, DRAM's are using latest design rule and often subject to failure in bit characteristics of several bits due to thermal stress at the time of assembling, and accordingly lowering the product yield. For the measure of such a problem, a redundancy decoder is desired which can be electrically written after sealing.

As for electrically writable fuses, floating gate MOS (electric writing), polysilicon (electric blowing), PN junction (electric destruction), oxidization film (electric destruction) are used. Any of the above listed elements might have restriction such as needing a high voltage transistor since high voltage is applied for writing. Among them, the simplest is the one that uses electric destruction of an oxidization film because of not needing a relatively special process nor a large current (a MOS transistor hardly makes large current flow). Especially, a DRAM is optimal for the object since the capacity film of a cell is thinner than the oxidization film of surrounding transistors. Such a fuse is often called 'antifuse' since it changes from a non-conducting state into a conducting state while a conventional laser blowing fuse changes from a conducting state into a non-conducting state.

A general example of such an antifuse circuit is shown in FIG. 6. This figure only shows an electrically writable redundancy fuse unit. A fuse unit 002 is constituted by connecting a read-out circuit 006 and a write-in driver 005 for applying writing voltage to an antifuse F04 and by inputting the output of the read-out circuit 006 into a holding circuit 007. The output Fout or #Fout of the holding circuit is used as the output of the fuse unit 002.

The write-in driver 005 uses a writing signal Write and a selection signal SEL as inputs and both the signals are input into a NAND gate NAND03. The NAND gate NAND03 uses a writing internal power source VWPP as a power source, and the output is input into a gate of a P-channel transistor QP03. The source of the P-channel transistor QP03 is used as the writing internal power source VWPP and the drain of the transistor QP03 is used as the output of the driver 005. A signal generated by inverting the writing signal Write by an inverter INV03 and the selection signal SEL are input into a NOR gate NOR01 and the output is input into the gate of an N-channel transistor QN05. The source of the transistor QN05 is wired to a ground terminal and the drain is wired to the output of the write-in driver 005. The output of the write-in driver 005 is connected to one end of electrodes of the antifuse F04.

The read-out circuit 006 wires the source of the P-channel transistor QP04 which uses a reading precharge signal PRD as a gate input to an internal power source Vint and the drain to a contact N01. The drain of an N-channel transistor QN06 which uses a reading signal READ as a gate signal to the contact N01 and the source to the output of the write-in driver 005. A differential amplifying circuit is structured by commonly connecting the source electrode of an N-channel transistor QN07 which uses a reference signal Vref as a gate signal and that of an N-channel transistor QN08 which uses the contact N001 as a gate signal and by wiring an N-channel transistor QN009 which uses an activation signal LOAD as a gate signal between the source electrode of an N-channel transistor QN07, QN08 and the ground terminal.

A P-channel transistor QP05 and an N-channel transistor QN10 are connected by a contact N02, and both the transistors are serially connected between the power source VDD and the drain of a transistor QN07 as one load element of the amplifying circuit. Similarly, a P-channel transistor QP06 and an N-channel transistor QN11 are connected by a contact N03, and both the transistors are serially connected between the power source and the drain of a transistor QN08 as one load element of the amplifying circuit. The gate electrodes of the transistors QP05, QN10 are wired to the contact N03 and the gate electrodes of the transistors QP06, QN11 to the contact N02 so as apply positive feedback thereto. The P-channel transistors QP07, QP08 which input the activation signal LOAD into the gate electrode are respectively connected between the respective contacts N02, N03 and the power source, and the contacts N02, N03 are used as outputs of the read-out circuit 006.

The holding circuit 007 connects NAND gates NAND04 and NAND05 in flip-flop manner to constitute a latch circuit. The holding circuit 007 uses the output of the read-out circuit 006, the inputs of the contacts N02, N03 and the output of the flip-flop is used as Fout or #Fout as the output of the holding circuit 007, or the output of the fuse unit 002.

Writing of the fuse unit 002 is performed when the input signal Write of a write-in driver 006 is 1. When the input signal Write is 0, regardless of the level of the selection signal SEL, the output of the NAND gate NAND03 is 1 and that of the NOR gate NOR01 is 0, both the transistors QP03, QN05 are in a non-conducting state, and the output of the write-in driver 005 is in high impedance (hereinafter, High-Z) state. The reason that the power source of the NAND gate NAND03 is the internal writing power source VWPP is to apply the same potential as the source of the transistor QP03 to its gate terminal and to make the transistor QP03 in a non-conducting state.

When the input signal Write is 1, the write-in driver 005 follows the selection signal SEL. When the signal SEL is 0, the ground potential or 0 level is applied to the output and when the SEI is 1 level, the internal power source VWPP as a writing potential or 1 level is applied to the output and a high voltage is applied to the fuse for writing. The transistor QN06 is provided in order to prevent the writing voltage VWPP from being transmitted to the internal contact N01 of the read-out circuit. When writing, it is preferable to make the transistor QN06 in a non-conducting state. If a non-conducting state of the transistor QP04 is assured during writing, no problem in writing occurs since the writing voltage is not transmitted to the internal contact Vint or other contacts through the contact N01 even when the gate potential of the transistor QN06 is fixed in the power source level.

Reading is performed by making the signal Write to be 0 level and the output of the write-in driver 005 to be in High-Z level and by making the signal READ to be in 1 level and connecting the antifuse F04 and the internal contact N01. In the following, the operation is described using a timing diagram of the respective control signals at the time of reading as shown in FIG. 7. As a process before reading, the activation signal LOAD is made to be in 0 level, and the differential amplifying circuit is deactivated and both the output contacts N02, N03 are precharged to be in 1 level. At the same time, a reading precharge signal PRD is made to be in 0 level, and the contact N01 and the antifuse F04 are precharged to the level of the internal power source Vint.

The power source Vint uses the same voltage (corresponding to VDL/2, where a power source potential for driving a sense amplifier for amplifying bit line data of a DRAM is assumed to be VDL) as one applied to a contact on the counter electrode contact of a cell capacity and prevents wrongly writing of an antifuse (capacity fuse) consisting of the same capacity film during reading. In such a state, when the fuse is not written, the fuse is in insulation state and the contact N01 keeps the precharge potential Vint. When the fuse is written and the insulation film is destroyed, a lower voltage is applied and the potential of the contact N01 differs according to whether the fuse is written or not.

When the activation signal LOAD of the differential amplifying circuit is in 1 level, the differential amplifying circuit is activated and compares the potential of the contact N01 and the reference potential Vref. When not being written, the contact N01 is higher, and accordingly, the output contact N02 of the read-out circuit is also higher but the contact N03 is lower. The value is written into the holding circuit 007 and the output Fout is in 0 level. On the contrary, when the fuse is written, the contact N01 is lower and as a result, the output Fout of the holding circuit 007 is in 1 level. After that, when the activation signal LOAD is in 0 level, the differential amplifying circuit is deactivated, both the output contacts N02, N03 of the read-out circuit are in 1 level and the read result is held in the holding circuit 007, and the reading completes.

In the above description of reading, time when the reading precharge of the contact N01 completes by PRD signal, coming to be in 1 level and that when the activation signal LOAD of the differential amplifying circuit is activated are not specifically indicated. The reason is that the potential of the contact N01 is lower if current flows in the antifuse F04 after completing precharge of the contact N01. Accordingly, if there is no leak in the initial fuse (unwritten state) and precharge completes, the difference of reading signals between unwritten state and written state is large and contributes to clearance for designing of the differential amplifying circuit.

On the other hand, if there is a leak in the initial unwritten fuse and precharge completes, the potential of the reading contact N01 is lower even though being unwritten and the difference of reading signals between unwritten state and written state is canceled. Thereby, if reading completes during activating of the reading precharge signal PRD, effect of the leak can be reduced. Which to select is a design item considering a process for determining the state of the fuse. Reading of the fuse can be performed during the operation of initial setting after inputting power source. Even if there is not such a cycle and the fuse data which were once read and held are re-read, reading can be performed at every refreshing since the data are not destroyed.

If reliability in writing and reading of a laser blowing type polysilicon or metallic thin film fuse and that of an antifuse (capacity fuse) are generally compared, a fuse applying polysilicon or metallic thin film can be stably manufactured since these materials are widely used for gate electrodes, wiring, etc. and having long history in manufacturing. Since writing is performed by blowing a fuse applying laser regardless of the manufacturing process, writing can be excellently stably performed.

On the other hand, the property of an antifuse depends largely on the property of an insulation film since the insulation film is formed in a very thin manner. For the cell capacity in a cell array and the capacity of an antifuse in the peripheral circuits, the manufacturing conditions that the cell density is realized in a very dense array type arrangement or the density is realized in a separate space without cell capacity around are different in view of arrangement, and as a result, the property of capacity of the fuse may differ largely.

Accordingly, the outcome of the antifuse has lower reliability than that of a polysilicon or metallic thin film fuse. In addition, for reducing costs, miniaturization is in process for every one or two years and the manufacturing process changes accordingly (at least the size of a cell decreases), and the manufacturing conditions of the antifuse should be tuned accordingly. It is apparent that writing voltage is 4-5 times of power voltage at the time of actual use, and that a high voltage element is needed for a write-in driver and effected by a change in the manufacturing process. Thereby, uncertainty in writing is always incorporated thereto. Because of such uncertainty laser blowing type polysilicon or metallic thin film fuses are widely used.

When an antifuse is applied to a redundancy decoder as described above and used for relieving the failure bit which may occur after assembling, the number of fuses necessary for specifying an address for relieving one redundancy should be about 20 or more for a memory product of 512 M, 1 G bit class. When writing in more than half (for example, 15), assuming rate of success in writing for every fuse being 99% (the write-in failure is 1%), the probability of writing failure of at least one redundancy decoder is about 14%, and the probability of all of 4-5 redundancy decoders being able to write rightly decreases down to 55-47%. Especially, as described above, since the manufacturing conditions around a cell changes every two or three years in concordance with refinement in manufacturing processes, the reliability of an antifuse decreases every time till completion of tuning of the manufacturing conditions, and thereby, the rate of success in writing of a redundancy decoder using the antifuse decreases and as a result, the manufacturing yield of semiconductor chips decreases.

SUMMARY OF THE INVENTION

More than that, when an electrically writing fuse represented by an antifuse is used for an option circuit (operation mode setting circuit) of a semiconductor device, similar inconvenience may occur. The present invention is for solving such problems and has the object to provide a fuse circuit capable of restraining lowering of manufacturing yield and reliability of a semiconductor chip and a semiconductor device using the fuse circuit even when writing failure occurs in the fuse.

In order to solve the above-mentioned problems, a fuse circuit according to the present invention is an electrically writable fuse circuit which comprises a first fuse unit provided with a first electrically writable fuse, a write-in driver, a read-out circuit and a holding circuit and a second fuse unit provided with a second electrically writable fuse, a write-in driver, a read-out circuit and a fuse holding circuit, and the state of logical add of the states of the first and second fuse units is used as the output of the electrically writable fuse circuit in the first and second fuse units.

According to the present invention, being structured in such a manner, when the state of an electrically writable fuse being subject to depending on the manufacturing process conditions and having relatively low reliability, a plurality of fuses are used for determining the state of one fuse and the logical add of these fuses are calculated. In other words, if at least one of the plurality of fuses is written, it judges to be written in a fuse. The reliability of writing of a fuse or of a semiconductor device having the fuse can be drastically increased by this structuring.

A fuse circuit according to the present invention may be applied to a redundancy decoder. That is, a redundancy decoder having an electrically writable fuse is also preferable, in which a fuse for selecting a normal signal or a reverse signal of the respective addresses or enabling bits to be used for determining the output of the decoder is structured by two fuses and the normal signal or the reverse signal of the respective addresses or the enabling bits are selected according to the logical add of the state of two fuses as described above.

The redundancy decoder may be structured in the following manner. A redundancy decoder circuit is also preferable, of which redundancy decoder having an electrically writable fuse comprises first and second redundancy decoders and an option signal that can take a first or second state, the first and second redundancy decoders independently determining redundancy addresses indicating the position of a defect cell when the option signal is in the first state, selecting a normal signal or reverse signal of the respective addresses or enabling bits of the first redundancy decoder according to a logical add of the state of a fuse corresponding to the addresses or enabling bits of the first and second redundancy decoders determining selection of the normal signal or reverse signal of the addresses or enabling bits to be input into the first and second redundancy decoders when the option signal is in the second state.

A fuse circuit according to the present invention may be also applied to an option circuit, or a generating circuit of an option signal for setting the operation mode. Two fuses may be used of the same kind as the one of which selection of the state of an option signal of the redundancy decoder circuit is used for determining the address of redundancy, the state of the option signal being determined by the logical add of the state of two fuses, the redundancy decoder circuit being structured using the option signal. Or the option may be determined by the logical add as a result of writing of a plurality of fuses in an option circuit which determines the option using an electrically writable fuse.

A semiconductor device comprising the fuse circuit or an option circuit according to the present invention, and a semiconductor device is enabling writing in the fuse circuit or the option circuit after sealing in a package.

A semiconductor memory device comprising the fuse circuit or a redunduncy decoder circuit according to the present invention, and a semiconductor memory device is enabling writing in the fuse circuit or the option circuit after sealing in a package.

A semiconductor device or a semiconductor memory device comprising the fuse circuit, an option circuit or a redunduncy decoder circuit according to the present invention, and a semiconductor device or a semiconductor memory device is enabling writing in the fuse circuit or the option circuit after sealing in a package.

A fuse circuit according to the present invention, the fuse may be constituted an antifuse.

As described above, according to the present invention, since a fuse circuit is constituted using the logical add as a result of writing of a plurality of fuses, the effective failure probability of a fuse is the product of failure rates of these elements and accordingly, the reliability of writing increases drastically. Lowering of the product yield caused by writing failure of a fuse can be remarkably improved by comprising such a fuse circuit, an option circuit applying the fuse circuit, or a redundancy decoder circuit on a semiconductor device or a semiconductor memory device.

DESCRIPTION OF THE PREFERRED EMBODIMENTS

In the following, embodiments of the present invention are described referring to attached drawings.

Figure 1:
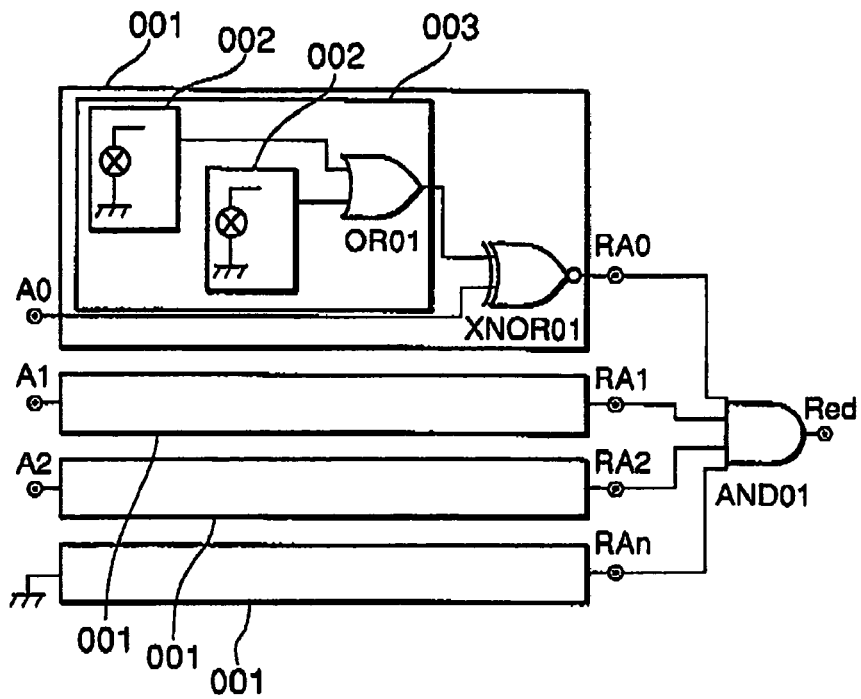
FIG. 1 is a first embodiment of the present invention, showing a redundancy decoder circuit constituted by an electrically writable fuse unit.
Figure 6:
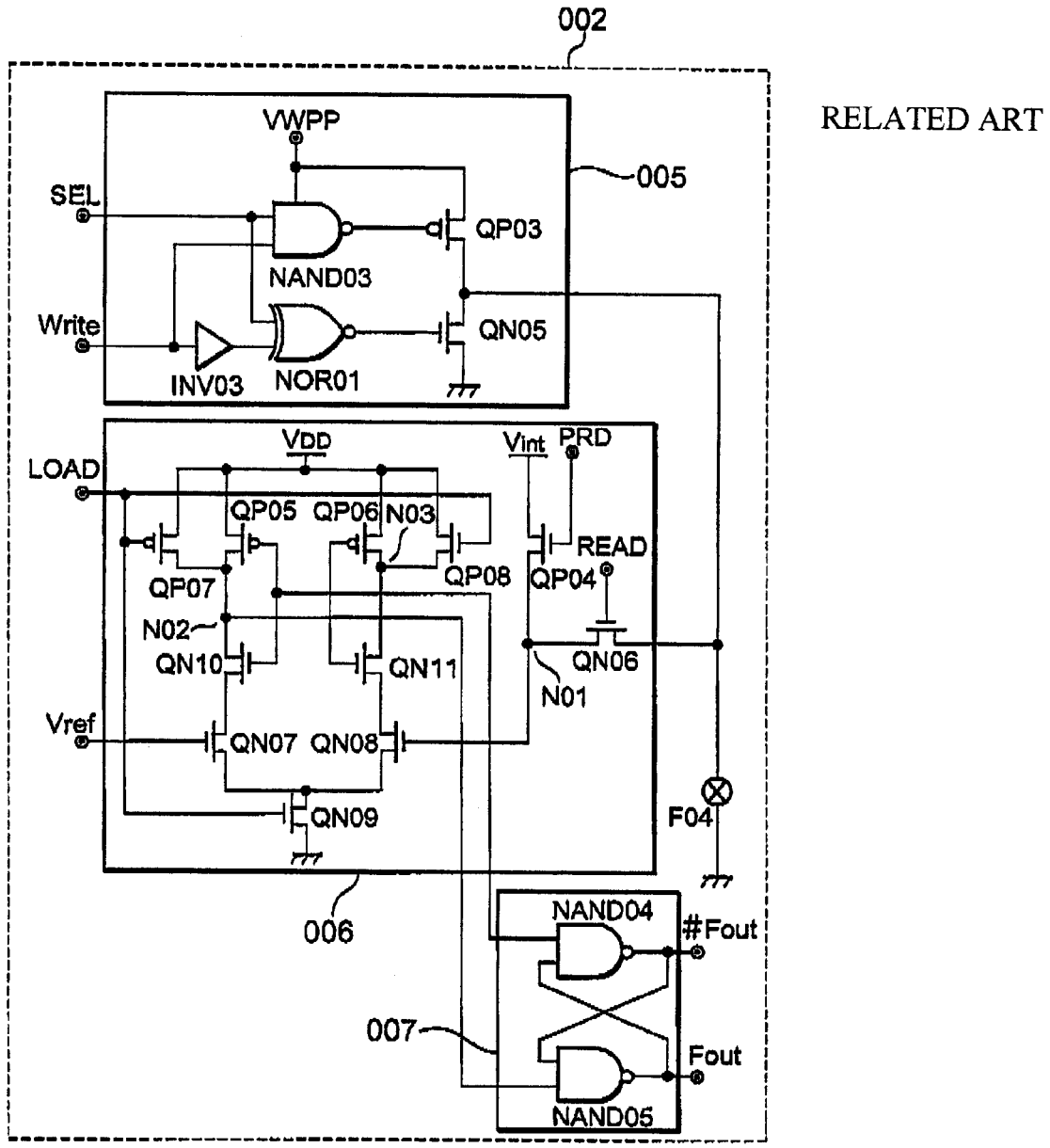
FIG. 6 shows an example of structure of a conventional electrically writable fuse unit.
Figure 7:
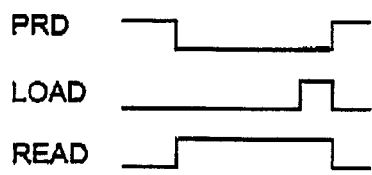
FIG. 7 shows a waveform of control signal at the time of reading out of the fuse unit shown in FIG. 6.

FIG. 1 shows a redundancy decoder circuit according to a first embodiment. For simplicity, in the embodiment, a redundancy is constituted only by three addresses. An electrically writable fuse unit 002 is shown in FIG. 6 as an example. The fuse unit outputs 0 level when an antifuse is in an unwritten state and the unit outputs 1 level when in a written state. The outputs of two fuse units 002 are input into an OR gate OR01, and the outputs of the OR gate OR01 would be the outputs of a fuse circuit 003 according to the present invention. The output of a fuse circuit 003 and the address (A0) are input into an exclusive NOR circuit XNOR01, and the output of the exclusive NOR circuit XNOR01 would be the output of the address unit 001 or a redundancy address RA0.

Addresses A1, A2 are input into the address unit 001 as similarly as A0, and redundancy addresses RA1, RA2 are output. Instead of inputting addresses into the address unit 001, a ground level is input and then, enabling bits REn are created. In such a circuit, when writing is performed in at least one of fuses of the fuse unit 002 being OR-coupled (logical add), 1 would be output in REn. Redundancy addresses RA0, RA1, RA2 and enabling bits REn are input into an AND gate AND01, and the output of the AND gate AND01 would be the redundancy decoder output Red. The AND gate AND01 outputs 1 level as the output Red only when all the signals input into AND01 are 1 level.

A fuse unit 002 indicated in the embodiments may be any type having a fuse, a write-in circuit, a read-out circuit, a holding circuit, etc. as shown in FIG. 6 as the example described above.

Since for the address unit according to the embodiment, the logical add of a plurality of fuses is calculated, the write-in failure of the circuit is the product of the respective write-in failures by the number of fuses. As in FIG. 1, when two fuse units are used, assuming the percent defective of each fuse is 1%, the percent defective of two fuses would be 0.01%. In the example described above, when about 20 fuses are used for relieving one bit and 15 fuses of them are written, the percent defective is as low as 0.15% and thereby, even if 4-5 bits are relieved by redundancy, the percent defective is 1% or lower, causing no problem practically.

As described above, the reliability of a fuse for write-in failure can be increased by OR-coupling the result of writing of the fuse and by using the fuse according to the present invention. It is apparent that the area for one set of redundancy fuses is much larger than that of spare bits (memory cell) for relieving when one bit of memory cell is relieved using redundancy. Accordingly, it is preferable to use an OR-coupled fuse when the reliability of writing in of a fuse in the initial stage of manufacturing. However, if the manufacturing process is refined and the reliability of writing of a fuse increases, there would be the need to stop OR-coupling and handle the respective fuses separately to twice as much as the number of sets of fuses or redundancies.

Figure 2:
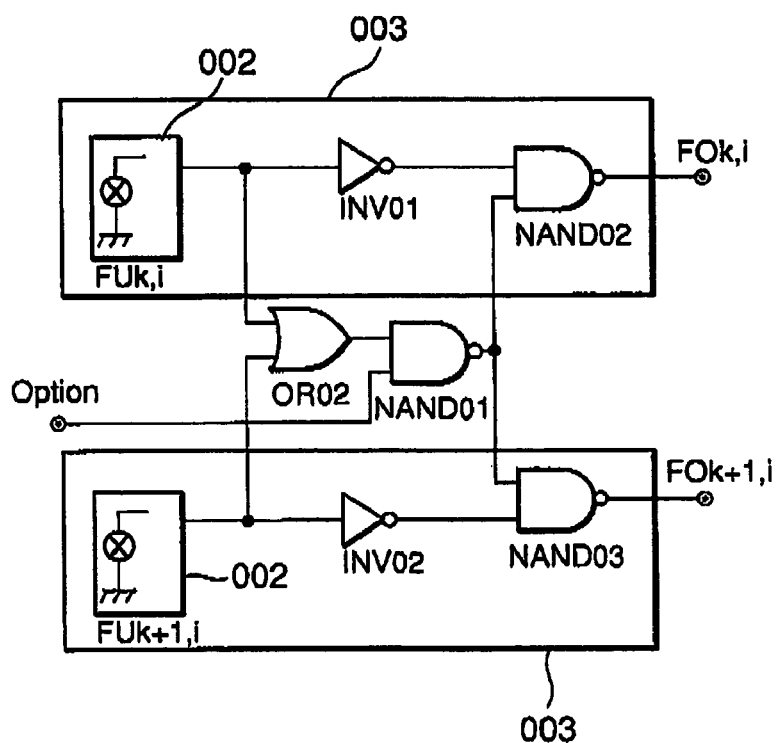
FIG. 2 is a second embodiment of the present invention, showing a fuse unit circuit allowing selection of acquisition of OR logic by an option signal.

FIG. 2 shows a second embodiment of the present invention, where an option signal is introduced for permitting switching whether to OR-couple fuses for increasing reliability or to use two sets of fuses. A fuse unit 002 is an electrically writable fuse unit shown in FIG. 6 as an example. The fuse unit outputs 0 when a fuse part is in an unwritten state and the unit outputs 1 when in a written state. Indexes k, k+1 and i as in suffixes FUk, i, FUk+1, i indicate the ith (for example, i is 0-3) fuse unit (respective addresses or enabling bits) used in the kth, (k+1)th redundancy sets.

The outputs of FUk, i and FUk+1, i of the fuse unit 002 are input into an OR gate OR02, and the output of the gate and an option signal Option are used as inputs for a NAND gate NAND01. A signal generated by inverting the output of the fuse unit FUk, i by an inverter INV01 and the output of the NAND gate NAND01 are input into a NAND gate NAND02, and the output is output as the output FOk, i of a fuse circuit 003 according to the present invention. Similarly, a signal generated by inverting the output of the fuse unit FUk+1, i by an inverter INV02 and the output of the NAND gate NAND01 are input into a NAND gate NAND03, and the output is output as the output FOk+1, i of a fuse circuit 003 according to the present invention.

Next, the operations of the second embodiment according to the present invention are described referring to FIG. 2. When an option signal Option is 0, the output of the NAND gate NAND01 is 1, and the NAND gates NAND02 and NAND03 for inputting the output signal function as inverters for receiving the signals of INV01 and INV02, respectively. Accordingly, the outputs of FUk, i and FUk+1, i of the fuse unit 002 are separately output as the outputs FOk, i and FOk+1, i of the fuse circuit 003 according to the present invention, respectively. When the option signal Option is 1, two fuse units 002 are OR-coupled for operation. Two sets of redundancies, for example the kth set and the (k+1)th set of fuse units 002 are assumed to be used in OR manner. It is assumed that when being unwritten, a fuse unit outputs 0 and when being written, the unit outputs 1.

Writing in a fuse means writing of data in both FUk, i and FUk+1, i of the fuse unit 002 (not writing in either or writing in both). When not being written, two outputs FOk, i and FOk+1, i of the fuse unit according to the present invention are 0. When both are written and any of FUk, i or FUk+1, i of the fuse unit 002 completes writing, the output of the OR gate OR02 is 1. As described above, The option signal Option is 1 and the output of the NAND gate NAND01 is also 1, and the outputs of the NAND gates NAND02, NAND03 using the output as the input, or the outputs FOk, i and FOk+1, i of the fuse circuit 003 according to the present invention are both 1.

When redundancy is constituted using the fuse unit according to the present invention, the outputs FOk, i (i=0-3) of the fuse unit according to the present invention are correlated to four outputs RA0-RA2 of the fuse unit in FIG. 1 and the kth set of redundancy is constituted, and similarly, the (k+1)th set of redundancy is constituted by the outputs FOk+1, i (i=0-3) of the fuse circuit 003 according to the present invention.

When being constituted in such a manner, for the kth set of redundancy and the (k+1)th set of redundancy, two sets are selected with the same address, and accordingly, so to speak, a multiple selection may occur. However, two bits are always selected, the same data are written in and the same data are read out, causing no problem even for a multiple selection. Accordingly, it would cause less trouble that two sets of redundancies are made into different circuits than forming the same sets for the kth and (k+1)th set of redundancies.

If a multiple selection is a problem for such redundancies, a multiple selection would not occur by constituting it in one of two sets of redundancies. In this example, when a redundancy as shown in FIG. 1 is constituted by the (k+1)th fuse set, an AND signal of a reverse signal of the option signal Option and one of fuse circuits 003, preferably of REn, are generated and both the signals are input into an AND gate AND01 instead of the output of the fuse unit as described above, and thereby, a multiple selection would not occur since the AND gate AND01 outputs only 0 as long as the option signal is 1. It is no need to say that for the output of the (k+1)th fuse circuit 003 in FIG. 2, the output of the fuse unit 002 may be simply the output of the fuse circuit 003 according to the present invention when a multiple selection in the (k+1)th set of redundancies is prevented in such a manner using enabling bits.

As described above, according to the present invention, a selection is possible between whether to increase the reliability of writing in of a fuse using an OR logic by using an option signal or whether to increase the number of redundancies without using an OR logic. For such an option signal, any conventional method may be used for generating an option signal. Preferably, when the same antifuse is used for generating of an option signal, using of the option can be selected after assembling. However, if the reliability of a fuse has a problem, the reliability can be apparently increased by using a technique of an OR logic (logical add) of a fuse according to the present invention.

Figure 3:
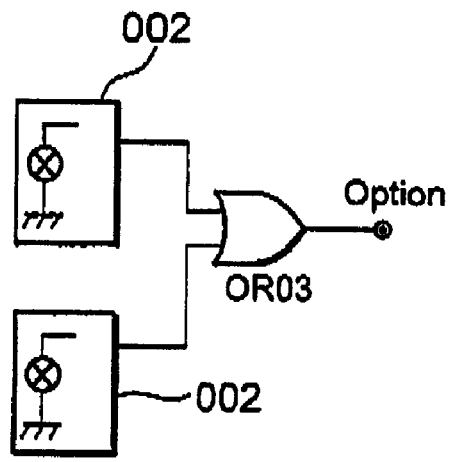
FIG. 3 is a third embodiment of the present invention, showing an example constituted using a fuse unit which can electrically write an option signal.
Figure 4:
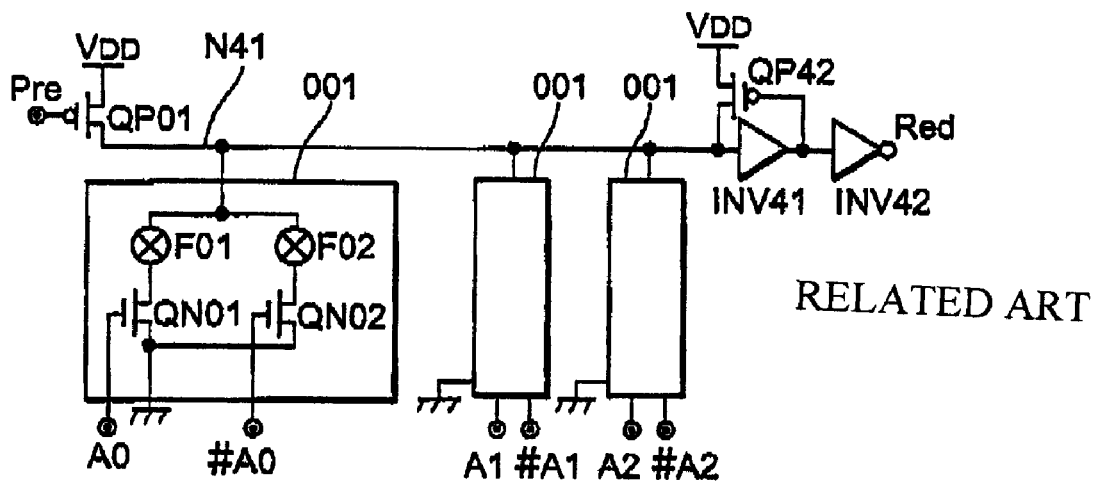
FIG. 4 shows an example of a NOR type in a conventional redundancy decoder.
Figure 5:
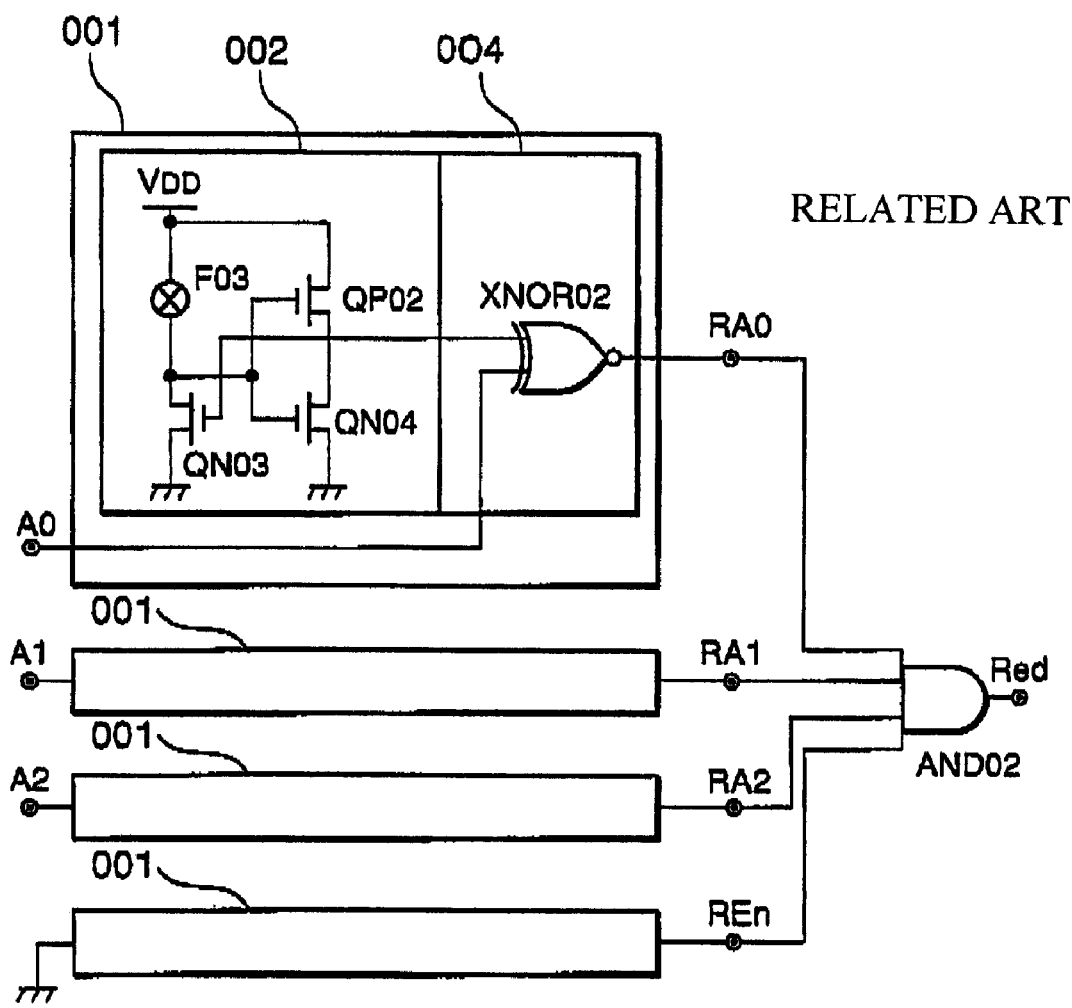
FIG. 5 shows an example of redundancy decoder which can perform conventional static operation.

FIG. 3 is a third embodiment of the present invention which regards generation of an option signal. A fuse unit 002 is an electrically writable fuse unit shown in FIG. 6 as an example. The fuse unit uses an antifuse and outputs 0 when the antifuse is in unwritten state and the antifuse outputs 1 when in written state. Two sets of fuse units 002 are used, the outputs are input into an OR gate OR03, and the output is an option signal Option. By constituting in such a manner, since the percent defective in writing in of a fuse can be significantly improved, an option signal with high reliability can be obtained even for an electrically writable fuse with low reliability.

If setting of the option as described above is determined before assembling into a package, it would be appropriate to determine the propriety of an OR logic (logical add) of a fuse for the whole set of redundancies. For an antifuse and the like, the setting can be determined after assembling, and thereby, redundancies can be used more efficiently by setting an option for every set taking an OR logic. Where there are 2N sets of redundancies, OR logics are taken for 2k+1 and 2k sets of redundancies, and N of options are set for every set of odd and even numbers.

As a method for using, addresses having found to be defective are read out and replaced into odd number of sets of redundancies. Again, tests are performed including power source margin, etc., and if additional defectives are found, the address is replaced into the next odd number of set of redundancies. In such a manner, the addresses of all the defective cells are replaced into redundancies. After that, tests are again performed, and if a defective is found at the same address as the replaced cell, it means that a write-in failure occurs for writing in the fuse unit 002 constituting a redundancy decoder according to the present invention. Accordingly, the same address is written in the even number of set of the fuse circuit 003, which makes a pair with the odd number of set of fuse circuit 003 in which the address is written in and the option is set to be 1 level. If no defectives are left before using all the odd number of redundancies, the replacement is considered to be successful. If some defectives are left, the addresses are serially written into even number of addresses not using an option, and if some defectives or a write-in failure which cannot be replaced are left even after using all the even number of writable redundancies, the replacement is considered to be unsuccessful. Thereby, all the redundancies that can be replaced can be used, and accordingly, the replacement efficiency increases.

Though in the above description, a case of low reliability in writing in of a fuse is assumed, another case of the opposite phenomenon can be considered. For example, a case can be considered such that writing in a fuse exhibits high reliability but the completion of an initial fuse has a problem. This means that a state of an antifuse being already written in at the time of manufacturing. This is a case that might occur when a fuse is fragile and actually destroyed during manufacturing for making easier in writing in a fuse. In such a case, the present invention can be applied when the AND logic (logical product) in write-in state of a fuse is made in write-in state. That is, since the write-in state is realized only when both the fuses are written in, it is appropriate only to take the logical product of the output of a fuse unit. In the embodiment of FIGS. 1 and 3, this can be realized only by changing an OR gate into an AND gate. In the embodiment of FIG. 2, this can be realized by changing an OR gate into an AND gate and by switching selection between the output of the fuse unit 002 and that of a NAND gate NAND01 by an option signal Option.

As described above, according to the present invention, the output of an electrically writable fuse unit, of which reliability in writing is relatively low, can be used using an OR logic, and thereby, the reliability regarding writing in of a fuse can be significantly increased. Also, especially by applying this circuit to a redundancy decoder or an option circuit (mode switching circuit) of a semiconductor memory device, writing in of a fuse circuit after assembling of a package can be performed in optimal conditions.

What is claimed is:

1. A redundancy decoder circuit equipped with an electrically writable fuse circuit, the electrically writable fuse circuit comprising a first fuse unit provided with a first electrically writable fuse and a second fuse unit provided with a second electrically writable fuse, wherein an output signal of the fuse circuit is obtained by writing identical information into the first and second fuses and by logically summing the outputs of the first and second fuses, wherein the redundancy decoder circuit selects a redundancy circuit using an address unit having the electrically writable fuse circuit and a logic circuit that judges coincidence/incoincedence between the output signal of the electrically writable fuse circuit and corresponding addresses or enabling bits.

2. The redundancy decoder circuit according to claim 1, wherein the first and second fuses comprise antifuses.

3. The redundancy decoder circuit according to claim 1, wherein each of the first and second fuse units further comprises a write-in driver, a read-out circuit and a holding circuit.

* * * * *